(12) United States Patent
Lee et al.

(10) Patent No.: US 7,102,907 B2
(45) Date of Patent: Sep. 5, 2006

(54) WAVELENGTH DIVISION MULTIPLEXED MEMORY MODULE, MEMORY SYSTEM AND METHOD

(75) Inventors: Terry R. Lee, Boise, ID (US); Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/238,322

(22) Filed: Sep. 9, 2002

(65) Prior Publication Data

US 2004/0047169 A1 Mar. 11, 2004

(51) Int. Cl.
*G11C 5/06* (2006.01)

(52) U.S. Cl. .............................. 365/63; 365/51; 365/52

(58) Field of Classification Search .................. 365/63, 365/51, 52
See application file for complete search history.

(56) References Cited

U.S. PATENT DOCUMENTS

| | | | | |
|---|---|---|---|---|
| 5,251,303 | A | 10/1993 | Fogg, Jr. et al. | 395/275 |
| 5,432,907 | A | 7/1995 | Picazo, Jr. et al. | 395/200 |
| 5,442,770 | A | 8/1995 | Barratt | 395/403 |
| 5,497,476 | A | 3/1996 | Oldfield et al. | 395/439 |
| 5,659,798 | A | 8/1997 | Blumrich et al. | 395/846 |
| 5,875,352 | A * | 2/1999 | Gentry et al. | 395/843 |
| 6,061,263 | A | 5/2000 | Boaz et al. | 365/51 |
| 6,067,262 | A | 5/2000 | Irrinki et al. | 365/201 |
| 6,073,190 | A | 6/2000 | Rooney | 710/56 |
| 6,105,075 | A | 8/2000 | Ghaffari | 710/5 |
| 6,137,709 | A | 10/2000 | Boaz et al. | 365/51 |
| 6,144,587 | A | 11/2000 | Yoshida | 365/189.05 |
| 6,167,465 | A | 12/2000 | Parvin et al. | 710/22 |
| 6,167,486 | A | 12/2000 | Lee et al. | 711/120 |

(Continued)

OTHER PUBLICATIONS

Micron Technology, Inc., Synchronous DRAM Module 512MB/1GB (x72, ECC) 168–PIN Registered FBGA SDRAM DIMM, Micron Technology, Inc., 2002, pp. 1–23.

*Primary Examiner*—Huan Hoang
(74) *Attorney, Agent, or Firm*—Dorsey & Whitney LLP

(57) ABSTRACT

A computer system includes a controller linked to a plurality of memory modules each of which has an optical memory hub and several memory devices coupled to the memory hub. The controller communicates with the memory hubs by coupling optical signals to and from the memory hubs using an optical communication path, such as one or more optical waveguides. In one example of the invention, the memory modules transmit and receive optical signals having different wavelengths. In another example of the invention, the memory modules receive optical signals corresponding to memory command and address signals at different wavelengths, but they transmit and receive optical signals corresponding to memory commands at the same wavelength.

63 Claims, 5 Drawing Sheets

U.S. PATENT DOCUMENTS

| | | | |
|---|---|---|---|
| 6,201,724 B1 | 3/2001 | Ishizaki et al. | 365/49 |
| 6,233,376 B1 | 5/2001 | Updegrove | 385/14 |
| 6,243,769 B1 | 6/2001 | Rooney | 710/56 |
| 6,246,618 B1 | 6/2001 | Yamamoto et al. | 365/200 |
| 6,285,349 B1 | 9/2001 | Smith | 345/147 |
| 6,301,637 B1 * | 10/2001 | Krull et al. | 711/112 |
| 6,327,642 B1 | 12/2001 | Lee et al. | 711/120 |
| 6,330,205 B1 | 12/2001 | Shimizu et al. | 365/230.06 |
| 6,347,055 B1 | 2/2002 | Motomura | 365/189.05 |
| 6,349,363 B1 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,373,777 B1 | 4/2002 | Suzuki | 365/230.03 |
| 6,381,190 B1 | 4/2002 | Shinkai | 365/230.03 |
| 6,421,744 B1 | 7/2002 | Morrison et al. | 710/22 |
| 6,434,639 B1 | 8/2002 | Haghighi | 710/39 |
| 6,462,978 B1 * | 10/2002 | Shibata et al. | 365/63 |
| 6,463,059 B1 | 10/2002 | Movshovich et al. | 370/389 |
| 6,470,422 B1 | 10/2002 | Cai et al. | 711/129 |
| 6,473,828 B1 | 10/2002 | Matsui | 711/104 |
| 6,477,614 B1 | 11/2002 | Leddige et al. | 711/5 |
| 6,477,621 B1 | 11/2002 | Lee et al. | 711/120 |
| 6,496,909 B1 | 12/2002 | Schimmel | 711/163 |
| 6,505,287 B1 | 1/2003 | Uematsu | 711/170 |
| 6,539,490 B1 | 3/2003 | Forbes et al. | 713/401 |
| 6,552,564 B1 | 4/2003 | Forbes et al. | 326/30 |
| 6,587,912 B1 | 7/2003 | Leddige et al. | 711/5 |
| 6,590,816 B1 | 7/2003 | Perner | 365/200 |
| 6,594,713 B1 * | 7/2003 | Fuoco et al. | 710/31 |
| 2002/0112119 A1 | 8/2002 | Halbert et al. | 711/115 |
| 2003/0043428 A1 * | 3/2003 | Baker et al. | 359/109 |

* cited by examiner

| $\lambda_1$ | $\lambda_2$ | $\lambda_3$ | $\lambda_4$ |
|---|---|---|---|
| MODULE 44a | MODULE 44b | MODULE 44c | MODULE 44d |

FIG.4

| $\lambda_1$ | $\lambda_2$ | $\lambda_3$ | $\lambda_4$ | $\lambda_5$ | $\lambda_6$ |
|---|---|---|---|---|---|
| READ DATA | WRITE DATA | C/A-44a | C/A-44b | C/A-44c | C/A-44d |

FIG.5

WAVELENGTH DIVISION MULTIPLEXED MEMORY MODULE, MEMORY SYSTEM AND METHOD

TECHNICAL FIELD

This invention relates to computer systems, and, more particularly, to a computer system having a memory hub coupling several memory devices to a processor or other memory access device.

BACKGROUND OF THE INVENTION

Memory modules are in common use in computer systems in the form of double in-line memory modules ("DIMMs"). An example of a conventional DIMM-type memory module 10 is shown in FIG. 1. The memory module 10 includes a circuit board substrate 14 on which several memory devices 20, typically dynamic random access memories ("DRAMs"), are mounted. In the DIMM-type memory module 10 shown in FIGS. 1, 8 memory devices 20 are mounted on each side of the substrate 14. Terminals 24 are formed along an edge of the substrate 14, which mate with slotted connectors (not shown) typically mounted on a computer system mother-board. The terminals 24 are electrically coupled to the power and signal terminals on the memory devices 20. The terminals 24 in the DIMM-type memory module 10 shown in FIG. 1 are on each side of the substrate 14. Also mounted on the substrate 14 may be a register 26 that stores command and address signals applied to the memory module 10 through the terminals 24 responsive to a clock signal that is also applied to the memory module 10 through the terminals 24. The register 26 then applies the command and address signals to the memory devices 20. Memory modules having a register 26 operating in this manner are known as "registered DRAM modules." However, it should be understood that memory modules often do not include the register 26, and they may include components in addition to those shown in FIG. 1.

As the speed of computer systems continues to increase, the operating speed of memory devices has increased in a corresponding manner. A portion of a computer system 30 shown in FIG. 2 includes three memory modules 10a,b,c coupled to a system controller 32 though a common data bus 34, address bus 36 and command bus 38. The system controller 32 initiates a memory operation by coupling a memory request in the form of a memory command and a memory address (generally in the form of a row address and a column address) to all of the memory modules 10 through the command bus 38 and the address bus 36, respectively. If the memory operation is a write operation, the system controller 32 will also couple write data to the memory modules 10 through the data bus 34. To prevent all of the memory modules 10 from responding to the memory request, the system controller 32 also generally applies a unique chip select or similar select signal to each of the memory modules 10. A unique select signal is thus applied to each of the memory modules 10 so that only the memory module 10 receiving the select signal responds to the memory request.

The bandwidth of data between the system controller 32 and the memory modules 10 could be increased by simultaneously accessing all of the 16 memory devices 20 (FIG. 1) in each of the modules 10. For example, if the 16 memory devices 20 included in the memory module 10 could be divided into 2 sets or "ranks" of 8 memory devices and both of the ranks could be accessed at the same time, data could be read from the ranks at a rate that is 2 times faster than the rate at which data can be read from each rank of the memory devices 20. Unfortunately, data can be accessed in conventional memory modules 10 only one rank of 6 memory devices 20 at a time. As the operating speed of memory devices continue to increase, the bandwidth of data coupled from the memory modules 10 threatens to be limited by the bandwidth of the data bus 34 coupled between the system controller 32 and the memory modules 10.

Another factor that limits the operating speed of computer systems using the system controller 32 coupled to the memory modules 10 through the buses 34–38 is the need to allow for a settling time between writing data to a memory module 10 and reading data from a memory module 10. When the system controller 32 outputs data to the memory modules, the data signals are reflected from various locations, such as the junction between the data bus 34 and terminals 24 (FIG. 1) on the substrates 14 of the modules 10. Therefore, signal induced noise is present on the data bus for a considerable period after data have been written to the memory modules 10. Signal induced noise is generated on the data bus for the same reason in a read operation when one of the memory modules 10 couples data onto the data bus 34 for transfer to the system controller 32. This noise must be allowed to settle before data are subsequently written to or read from the memory modules 10 or else the noise may be mistakenly interpreted as read or write data. The need to provide for a settling time can markedly reduce the effective memory bandwidth of computer systems and other devices using memory modules.

There is therefore a need for a computer system architecture and memory module that permits a higher bandwidth of data transfer to and from memory modules and that does not require settling times between a memory accesses.

SUMMARY OF THE INVENTION

A plurality of memory modules are optically coupled to a controller. Each of the memory modules includes a plurality of memory devices and an optical memory hub. The optical memory hub in each memory module is electrically coupled to the memory devices in the module, and includes an optical input/output port coupled to an optical input/output port of the controller. The optical memory hub in each memory module receives optical input signals and applies corresponding electrical signals to the memory devices in the module. The optical memory hub in each memory module also receives electrical signals from the memory devices in the module and transmits corresponding optical output signals. The optical memory hub in each of the memory modules receives or transmits at least some optical signals at a wavelength that is different from the wavelength of at least some optical signals received or transmitted by the optical memory hubs in a plurality of the other memory modules.

BRIEF DESCRIPTION OF THE DRAWINGS

FIG. 4 is a diagram illustrating one example of a communications protocol that can be used to allow the controller and memory modules shown in FIG. 3 to communicate with each other.

FIG. 5 is a diagram illustrating another example of a communications protocol that can be used to allow the controller and memory modules shown in FIG. 3 to communicate with each other.

DETAILED DESCRIPTION OF THE INVENTION

Figure 1:
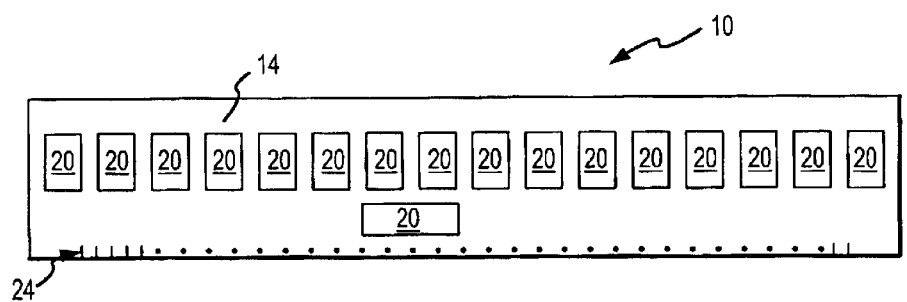
FIG. 1 is a plan view of a conventional memory module.
Figure 2:
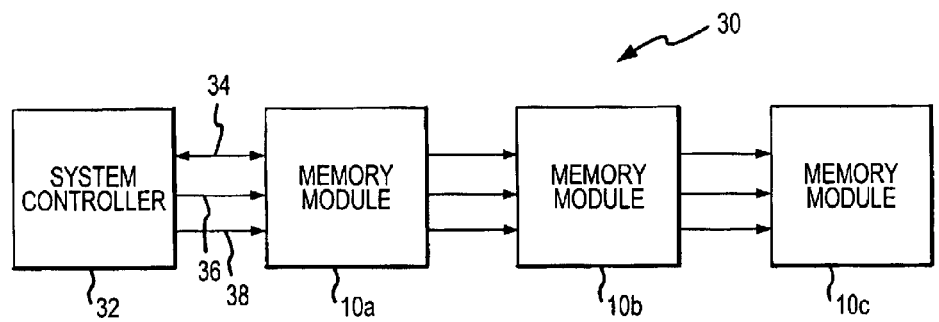
FIG. 2 is a block diagram of a portion of a conventional computer system using several of the memory modules shown in FIG. 1.
Figure 3:
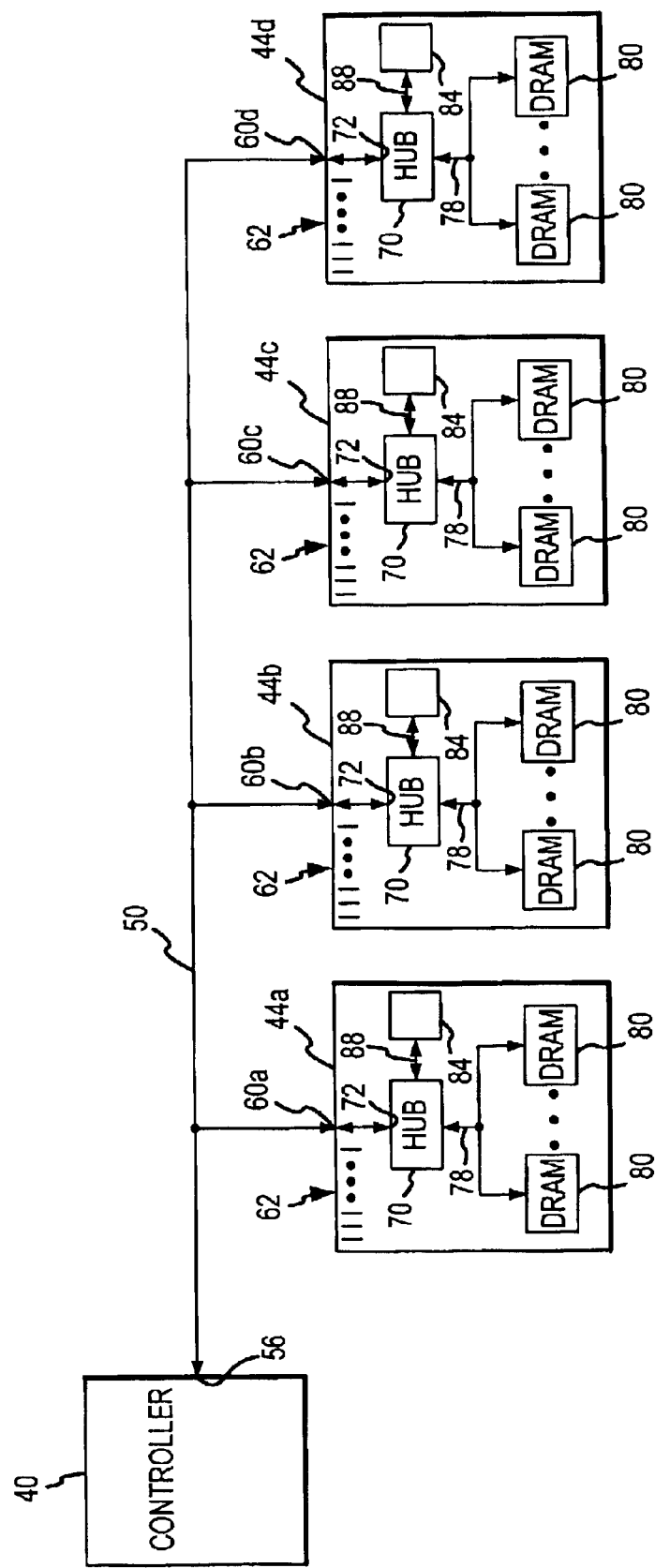
FIG. 3 is a block diagram of a portion of a computer system including a controller and several memory modules according to one example of the present invention.

FIG. 3 is a block diagram of a portion of a computer system according to one example of the present invention. A controller 40, such as a system controller or a memory controller, is coupled to 4 memory modules 44a–d though an optical communication path 50, although a greater or less number of modules 44 may be coupled to the controller 40. The controller 40 and the memory modules 44a–d are coupled to the optical communication path 50 through optical input/output ports 56, 62a–d, respectively. The controller 40 may communicate with the memory modules 44 in any of a variety of communications protocols, but they preferably communicate using optical signal packets that contain data, address and command information. The optical communication path 50 may be one or more optical waveguides, such as optical fibers or waveguides mounted on printed circuit boards, free space, or some other optical coupling medium that allows light to be transmitted between the controller 40 and the memory modules 44. The controller 40 can transmit and receive light at any of a plurality of wavelengths $\lambda$. The memory modules 44 preferably can also transmit and receive light at any of a plurality of wavelengths $\lambda$, as will be explained in greater detail below. The memory modules 44 also preferably have electrical terminals 58 through which at least power may be applied to the memory modules 44.

As further shown in FIG. 3, each memory module 44 includes a wave-division multiplexed optical hub 70 having an optical port 72 optically coupled to the communication path 50. The optical hub 70 can receive light at any of a plurality of wavelengths $\lambda$, and it converts the received light into corresponding electrical signals that are applied to a bus system 78. The optical hub 70 also receives electrical signals from the bus system 78, and it converts the received electrical signals to corresponding optical signals, preferably at any of a plurality of wavelengths $\lambda$. These optical signals are applied to the optical port 72 and coupled to the controller 40 through the optical communication path. The bus system 78 couples the optical hub 70 to several memory devices 80, which may be, for example, synchronous random access memories ("SDRAMs"). The bus system 78 may include, for example, separate command, address and data buses, although it may alternatively include a greater or lesser number of buses. For example, a single bus may be used to couple one or more packets containing command, address and data bits between the optical hub 70 and the memory devices 80.

With further reference to FIG. 3, each memory module 44 may also include a volatile or non-volatile memory device 84, such as an electrically erasable programmable read only memory ("EEPROM"), for storing parameters indicative of the operation of the memory module 44. For example, the memory device 84 may store information specifying the wavelength $\lambda$ the memory module 44 will use to communicate with the controller 40 through the optical communication path 50. The memory device 84 is preferably electrically coupled to the optical hub 70 through lines 88. However, the non-volatile memory device 84 may also be programmed through a serial bus (not shown) of the type that is typically used to program EEPROMs in memory modules. The parameters of the memory module 44 are read by the controller 40 through a bus 52, which may be either a serial bus or a parallel bus. The controller 40 may read the parameters from the memory device 84 at power-up, for example, to allow the controller 40 to configure itself in accordance with the parameters of the memory module 44.

Although the optical communication path 50 may include a single communication link through which command, address and data signals are coupled, it preferably includes several communication links operating in conjunction with each other. For example, a first communication link may be used to couple the data signals between the controller 40 and the memory module 44, and a second communication link may be used to couple command and address signals from the controller 40 to the memory module 44. In either case, the command, data and address signals are preferably coupled through a conventional communication protocol, such as by sending data packets, time-division multiplexing, etc. Whatever communication protocol is used, wavelength division multiplexing is used to allow the controller 40 to selectively communicate with the memory modules. A variety of wavelength division multiplexing protocols may be used to allow communication between the controller 40 and the memory modules 44. For example, with reference to FIG. 4, a first wavelength $\lambda_1$ is used to communicate between the controller 40 and the optical hub 70 in the first memory module 44a, a second wavelength $\lambda_2$ is used to communicate between the controller 40 and the optical hub 70 in the second memory module 44b, a third wavelength $\lambda_3$ is used to communicate between the controller 40 and the optical hub 70 in the third memory module 44c, and a fourth wavelength $\lambda_4$ is used to communicate between the controller 40 and the optical hub 70 in the fourth memory module 44d. Using this protocol, the controller 40 may simultaneously communicate with two or more memory modules 44, and, in doing so, may be simultaneously performing two or more memory operations of the same type or of different types. For example, the controller 40 may be simultaneously reading data from the second memory module 44b using light at the second wavelength $\lambda_2$, and reading data from the fourth memory module 44d using light at the fourth wavelength $\lambda_4$. As a further example, the controller 40 may be writing data to the first memory module 44a using light at the first wavelength $\lambda_1$ at the same time the controller 40 is reading data from the third memory module 44c using light at the third wavelength $\lambda_3$. Use of this protocol is most appropriate where several memory modules 44 are coupled to the controller since there is no advantage to using this protocol of wavelength division multiplexing where a single memory module 44 is coupled to the controller 40.

In another aspect of the invention, the communications protocol shown in FIG. 5 can be used. In the protocol, read data are coupled from a plurality the memory modules 44 using optical signals having a first wavelength $\lambda_1$, and write data are coupled to a plurality the memory modules 44 using optical signals having a second wavelength $\lambda_2$. In order to allow the controller 40 to selectively direct memory requests to only one of the memory modules 44, the command and address signals are coupled to each of the memory modules 44 at different wavelengths. More specifically, as shown in FIG. 5, command and address signals are coupled to the first memory module 44a at a third wavelength $\lambda_3$, command and address signals are coupled to the second memory module 44b at a fourth wavelength $\lambda_4$, command and address signals are coupled to the third memory module 44c at a fifth wavelength $\lambda_5$, and command and address signals are coupled to the fourth memory module 44d at a sixth wavelength $\lambda_6$.

The advantage of the communication protocol shown in FIG. 5 over the protocol shown in FIG. 4 is that the protocol of FIG. 5 allows the controller 40 to read from one memory module, e.g., memory module 44b, at the same time that the controller 40 is writing to another memory module, e.g., memory module 44c. However, unlike the protocol shown in FIG. 4, the protocol shown in FIG. 5 does not allow read data to be coupled from two different memory modules 44 at the same time. The protocol shown in FIG. 5 is best suited to systems having relatively few memory modules 44 and/or processors or other memory access devices because there is less likely to be data bus conflicts in such systems.

Although two communications protocols have been shown in the drawings and explained herein, it should be understood that other communications protocols may be used. For example, instead of coupling commands and addresses to the memory modules 44 using optical signals having different wavelengths for each memory module, the same wavelength, may be used for a plurality the memory modules 44, and some other means may be used to selectively enable only one of the memory modules 44 to respond to the commands and addresses. For example, the memory modules 44 may have non-overlapping addresses so that the address signals coupled to the memory modules 44 uniquely identify each module 44. Other communication protocols that may be used will be apparent to one skilled in the art.

Although the wavelength division multiplexing protocol that is used by the controller 40 may be fixed, the controller 40 may dynamically select a wavelength division multiplexing protocol based on a variety of operating conditions. For example, the controller 40 may select a protocol based on the number of memory modules 44 in a system. For a larger number of memory modules, the wavelength division multiplexing protocol shown in FIG. 4 might be selected. For a smaller number of memory modules, the wavelength division multiplexing protocol shown in FIG. 5 might be selected. The controller 40 might also select a wavelength division multiplexing protocol based on the nature of the software application currently being executed in a computer system. For example, a graphics intensive application like video games might select one type of wavelength division multiplexing protocol while a computationally intensive application like spreadsheets might select a different wavelength division multiplexing protocol.

There are also a variety of techniques that can be used to designate the wavelength $\lambda$ of the optical signals each memory module 44 can receive and the wavelength $\lambda$ of the optical signals each memory module 44 can transmit. Each memory module 44 can, of course, be fabricated to receive and transmit optical signals having specific wavelengths $\lambda$. It would then be necessary to ensure that memory module operating at different wavelengths were present in a computer system or other electronic system. It would be less desirable for two memory modules 44 operating at the same wavelength $\lambda$ to be present in a system. It is preferable to make all of the memory modules 44 identical, and to program them for different wavelengths after the modules 44 have been installed in a computer system or other electronic system.

Figure 6:
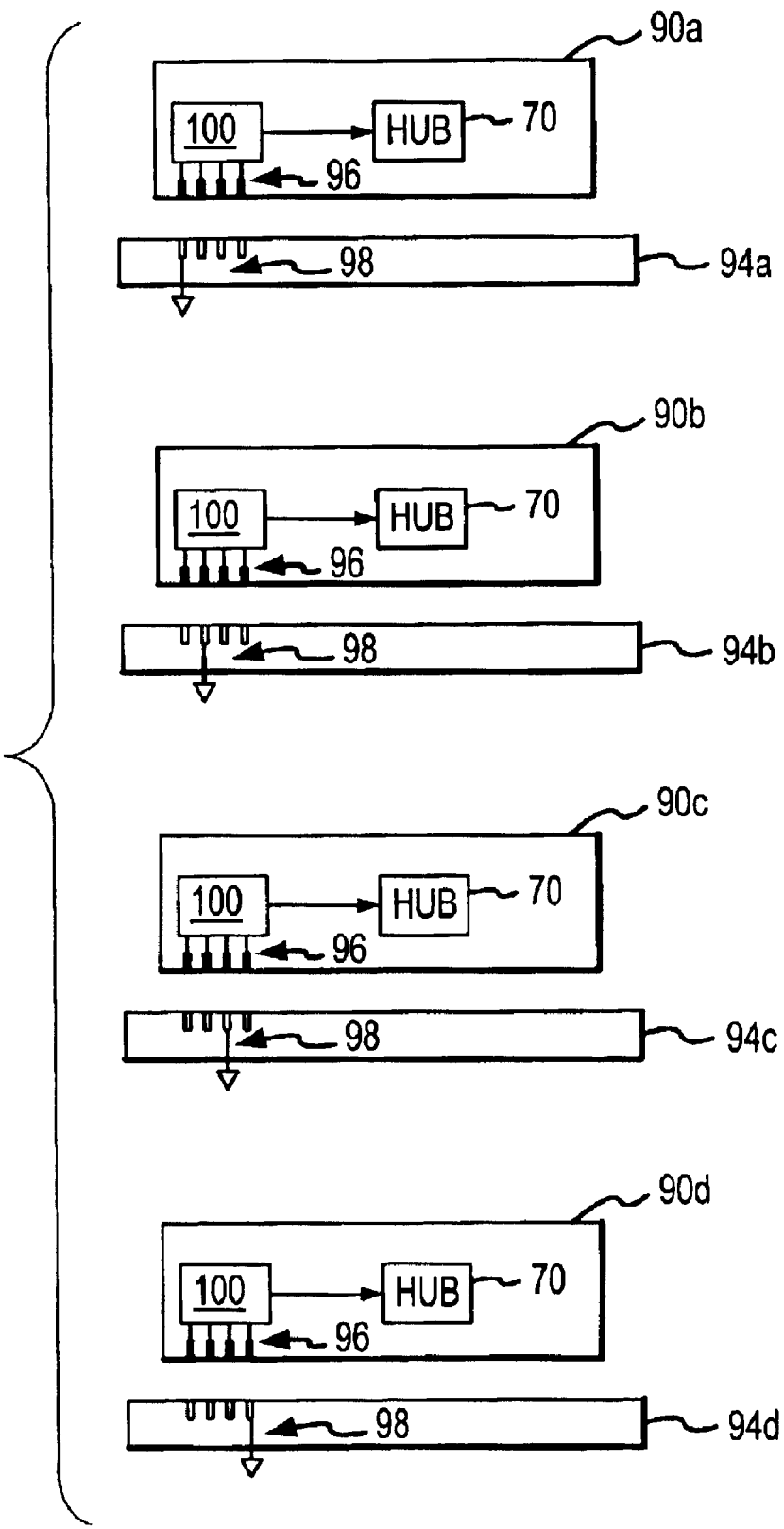
FIG. 6 is a schematic plan view a memory module showing one example of a technique for programming the module according to invention.

One technique for programming each of several memory modules to operate at respective wavelengths $\lambda$ (for either read data, write data, commands or addresses) is to apply at least one wavelength identifying signal to the memory module 44 based on which connector receives the memory module. For example, as shown in FIG. 6, each of four memory modules 90a–d is plugged into a respective slotted connector 94a–d. A number of wavelength identifying terminals 96 are provided at the edge of each of the modules 90. Each of the connectors 94 has one of several terminals 98 coupled to a predetermined voltage, such as ground, based on the location of the connector 94. Thus, the first connector 94a has its first terminal 98 coupled to ground, the second connector 94b has its second terminal 98 coupled to ground, the third connector 94c has its third terminal 98 coupled to ground, and the fourth connector 94d has its fourth terminal 98 coupled to ground. Each of the memory modules 44 includes a detection circuit 100 coupled to the wavelength identifying terminals 96 and to the optical hub 70. Using conventional circuitry, the detection circuitry 100 can detect which wavelength identifying terminal 96 is coupled to ground and cause the optical hub 70 in each of the memory modules 90 to transmit and receive optical signals at wavelengths corresponding to the connector 94 in which the memory module 90 is inserted. Other encoding schemes could also be used, such as by binary coding the terminals coupled to ground.

Another approach to programming memory modules is to program the memory modules upon power-up or at some other time. For example, a respective select signal can be applied sequentially to each of the memory modules 44 (FIG. 3) while to controller 40 outputs an optical signal having the wavelength $\lambda$ that the memory module 44 will transmit and/or receive. For example, an optical signal having a wavelength of $\lambda_1$ may be transmitted by the controller 40 while the controller 40 applies a select signal to the first memory module 44a. The controller 40 then outputs an optical signal having a wavelength of $\lambda_2$ while applying a select signal to the second memory module 44b, etc. Thereafter the first memory module 44a will transmit and receive optical signals having the first wavelength $\lambda_1$, and the second memory module 44b will transmit and receive optical signals having the first wavelength $\lambda_2$. Other means of programming the memory modules 44 to receive and transmit light at respective wavelengths will be apparent to one skilled in the art. For example, as previously mentioned, however, the memory modules 44 may also be programmed through a serial bus (not shown) of the type that is typically used to program EEPROMs in memory modules.

Figure 7:
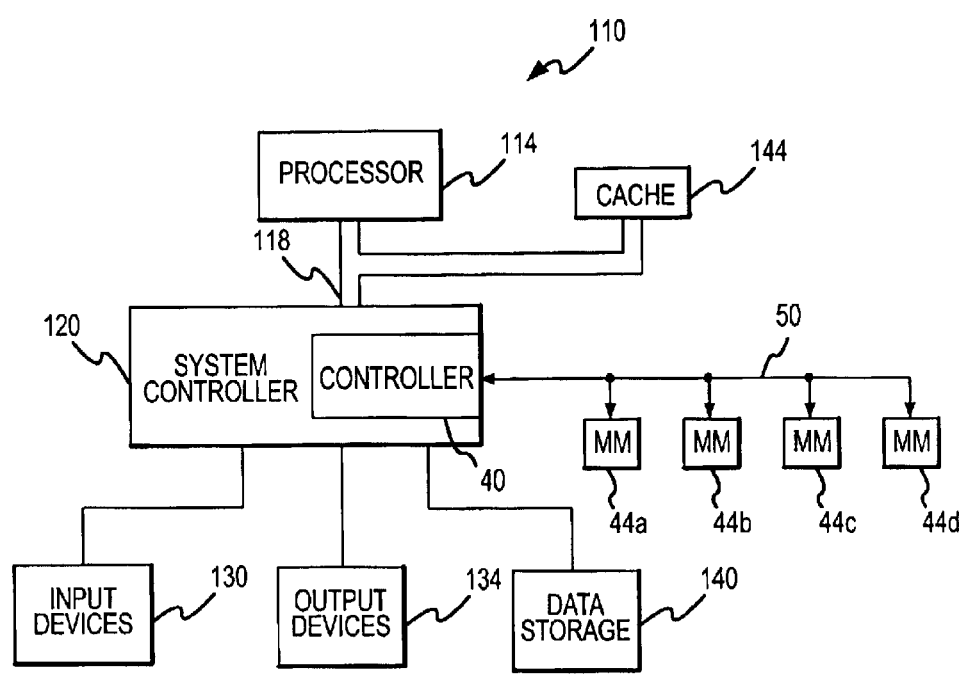
FIG. 7 is a block diagram of a computer system using the controller and memory modules of FIG. 3 according to one example of the invention.

A computer system 110 using the controller 40 and memory modules 44 of FIG. 3 according to one example of the invention is shown in FIG. 7. The computer system 110 includes a processor 114 for performing various computing functions, such as executing specific software to perform specific calculations or tasks. The processor 114 includes a processor bus 118 that normally includes an address bus, a control bus, and a data bus. The computer system 110 includes a system controller 120 that is coupled to the processor bus 118. The system controller 120 also includes the controller 40, which is, in turn, optically coupled to memory modules 44a–d through the optical communication path 50. However, it will be understood that the controller 40 may be external to the system controller 120 and coupled to it or some other component in the computer system 110, such as the processor 114. In addition, the computer system 110 includes one or more input devices 130, such as a keyboard or a mouse, coupled to the processor 114 through the system controller 120 to allow an operator to interface with the computer system 110. Typically, the computer system 110 also includes one or more output devices 134 coupled to the processor 114 through the system controller 120, such output devices typically being a printer or a video terminal. One or more data storage devices 140 are also typically coupled to the processor 114 through the system controller 120 to allow the processor 114 to store data or retrieve data from internal or external storage media (not shown). Examples of typical storage devices 140 include hard and floppy disks, tape cassettes, and compact disk read-only memories (CD-ROMs). The processor 114 is also typically coupled to cache memory 144, which is usually static random access memory ("SRAM").

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory module, comprising:
    an insulative substrate;
    a plurality of memory devices mounted on the substrate, each of the memory devices having a plurality of electrical input and output terminals including electrical terminals outputting read data signals, electrical terminals inputting write data signals; and electrical terminals inputting command and address signals;
    an optical memory hub mounted on the substrate and operable to receive or transmit optical signals having a plurality of wavelengths, the optical memory hub having an optical input/output port and a plurality of electrical input and output terminals including electrical terminals outputting write data signals, electrical terminals inputting read data signals, and electrical terminals outputting command and address signals, the optical memory hub being operable to receive optical input signals coupled to the optical port and to apply corresponding electrical signals to the electrical terminals of the optical memory hub, the optical memory hub being further operable to receive electrical signals at the electrical terminals of the optical memory hub and to apply optical output signals to the optical port, at least some of the optical signals coupled to or from the optical port of the optical memory hub being at different wavelengths;
    a programming circuit coupled to circuitry in the optical memory hub, the programming circuit being operable to receive a programming signal and to output a signal to the optical memory hub that causes the optical memory hub to receive or transmit optical signals having one of the plurality of wavelengths; and
    electrical conductors formed on the substrate, the electrical conductors coupling the electrical terminals of the optical memory hub to the electrical conductors of the memory devices.

2. The memory module of claim 1 wherein the optical input signals have a first wavelength and the optical output signals have a second wavelength that is different from the first wavelength.

3. The memory module of claim 1 wherein the optical input signals comprise optical write data signals having a first wavelength and the optical output signals comprise optical read data signals having a second wavelength that is different from the first wavelength.

4. The memory module of claim 1 wherein the optical input signals comprise optical address or command signals having a first wavelength and the optical output signals comprise optical read data signals having a second wavelength that is different from the first wavelength.

5. The memory module of claim 4 wherein the optical input signals further comprise optical write data signals having the second wavelength.

6. The memory module of claim 1 wherein the optical memory hub is operable to output optical signals at a first wavelength corresponding to electrical read data signals received from at least one of the memory devices, to output electrical write data signals corresponding to optical signals received at the optical port having a second wavelength, and to output electrical command and address signals corresponding to optical signals received at the optical port having a third wavelength.

7. The memory module of claim 1, further comprising a plurality of wavelength detecting electrical terminals fanned on the substrate, and wherein the programming circuit comprises a detection circuit coupled to the wavelength detecting electrical terminals and to the optical memory hub, the detection circuitry being operable to detect which wavelength detecting electrical terminal is coupled to a predetermined voltage and to cause the optical hub to transmit or receive an optical signal having a wavelength corresponding to which of the wavelength detecting electrical terminal receives the predetermined voltage.

8. The memory module of claim 1, wherein the substrate includes an electrical terminal to which a select signal may be coupled, the electrical terminal being coupled to the optical memory hub, and wherein the optical memory hub is operable to receive or transmit optical signals at a frequency corresponding to the wavelength of an optical signal being received by the optical memory hub when a select signal is applied to the electrical terminal.

9. The memory module of claim 1 wherein the optical memory hub is operable to transmit signal packets corresponding to electrical signals input to the electrical input terminals of the optical memory hub and to receive signal packets corresponding to electrical signals output from the electrical output terminals of the optical memory hub.

10. A memory system, comprising:
    a plurality of memory modules, each of the memory modules comprising:
        a plurality of memory devices each having a plurality of electrical input and output terminals;
        an optical memory hub operable to receive or transmit optical signals having a plurality of wavelengths, and having an optical input/output port and a plurality of electrical input and output terminals, the optical memory hub being operable to receive optical input signals coupled to the optical port and to apply corresponding electrical signals to the electrical output terminals of the optical memory hub, the optical memory hub being further operable to receive electrical signals at the electrical input terminals of the optical memory hub and to apply optical output signals to the optical port, the optical hub of each of the memory modules receiving or transmitting at least some optical signals at a wavelength that is different from the wavelength of at least some optical signals received or transmitted by the optical memory hub of a plurality of the other memory modules;
        a programming circuit coupled to circuitry in the optical memory hub, the programming circuit being operable to receive a programming signal and to output a signal to the optical memory hub that causes the optical memory hub to receive or transmit optical signals having one of the plurality of wavelengths; and electrical conductors coupling the electrical terminals of the optical memory hub to the electrical conductors of the memory devices;

a controller having an optical input/output port, the controller being operable to receive and transmit optical signals at the wavelengths of the optical signals transmitted or received by the optical memory modules in a plurality of the memory modules; and an optical communication path coupling the optical input/output port of the controller to the optical input/output port of the optical memory hubs of a plurality of the memory modules.

11. The memory system of claim 10 wherein the optical signals coupled to the optical hubs in a plurality of the memory modules have a first wavelength and the optical signals coupled from the optical hubs in a plurality of the memory modules have a second wavelength that is different from the first wavelength.

12. The memory system of claim 10 wherein the optical signals coupled to the optical hubs in a plurality of the memory modules comprise optical write data signals having a first wavelength and the optical signals coupled from the optical hubs in a plurality of the memory modules comprise optical read data signals having a second wavelength that is different from the first wavelength.

13. The memory system of claim 10 wherein the optical signals coupled to the optical hubs in each of the memory modules comprise optical address or command signals having a wavelength that is different from the wavelength of the optical address or command signals coupled to the memory hub in each of the other memory modules in the memory system.

14. The memory system of claim 13 wherein the optical signals coupled to the optical hubs in each of the memory modules further comprise optical write data signals having a wavelength that is different from the wavelength of the optical address or command signals coupled to the memory hubs in the memory modules.

15. The memory system of claim 14 wherein the optical signals coupled from the optical hubs in each of the memory modules further comprise optical read data signals having the same wavelength as the optical write data signals.

16. The memory system of claim 13 wherein the optical signals coupled from the optical hubs in each of the memory modules further comprise optical read data signals having a wavelength that is different from the wavelength of the optical address or command signals coupled to the memory hubs in the memory modules.

17. The memory system of claim 10 wherein the optical input signals coupled to and the optical output signals coupled from the memory hub on each of the memory modules has a wavelength that is different from the wavelength of the optical input signals coupled to and the optical output signals coupled from the memory hub on each of the other memory modules in the memory system.

18. The memory system of claim 10 wherein the optical memory hub is operable to output optical signals at a first wavelength corresponding to electrical read data signals received from at least one of the memory devices, to output electrical write data signals corresponding to optical signals received at the optical port having a second wavelength, and to output electrical command and address signals corresponding to optical signals received at the optical port having a third wavelength.

19. The memory system of claim 10 wherein each of the memory modules further comprises a plurality of wavelength detecting electrical terminals, and wherein the programming circuit comprises a detection circuit coupled to the wavelength detecting electrical terminals and to the optical memory hub, the detection circuitry being operable to detect which wavelength detecting electrical terminal is coupled to a predetermined voltage and to cause the optical hub to transmit or receive an optical signal having a wavelength corresponding to which of the wavelength detecting electrical terminal receives the predetermined voltage.

20. The memory system of claim 10 wherein the memory module includes an electrical terminal to which a select signal may be coupled, the electrical terminal being coupled to the optical memory hub, and wherein the optical memory hub is operable to receive or transmit optical signals at a frequency corresponding to the wavelength of an optical signal being received by the optical memory hub when a select signal is applied to the electrical terminal.

21. The memory system of claim 10 wherein the optical memory hub is operable to transmit signal packets corresponding to electrical signals input to the electrical input terminals of the optical memory hub and to receive signal packets corresponding to electrical signals output from the electrical output terminals of the optical memory hub.

22. The memory system of claim 10 wherein the optical communication path comprises at least one optical waveguide coupling the optical input/output port of the controller to the optical input/output port of the optical memory hubs of a plurality of the memory modules.

23. The memory system of claim 10 wherein the controller is operable to communicate with the memory modules using a wavelength division multiplexing protocol that varies as a function of the number of memory modules in the memory system.

24. A computer system, comprising:

a processing unit operable to perform computing functions;

a system controller coupled to the processing unit, the system controller operating in synchronism with a system clock signal;

at least one input device coupled to the processing unit through the system controller;

at least one output device coupled to the processing unit through the system controller;

at least one data storage devices coupled to the processing unit through the system controller;

a plurality of memory modules, each of the memory modules comprising:

a plurality of memory devices each having a plurality of electrical input and output terminals;

an optical memory hub operable to receive or transmit optical signals having a plurality of wavelengths, and having an optical input/output port and a plurality of electrical input and output terminals, the optical memory hub being operable to receive optical input signals coupled to the optical port and to apply corresponding electrical signals to the electrical output terminals of the optical memory hub, the optical memory hub being further operable to receive electrical signals at the electrical input terminals of the optical memory hub and to apply optical output signals to the optical port, the optical hub of each of the memory modules receiving or transmitting at least some optical signals at a wavelength that is different from the wavelength of at least some optical signals received or transmitted by the optical memory hub of a plurality of the other memory modules; and electrical conductors coupling the electrical terminals of the optical memory hub to the electrical conductors of the memory devices;

a memory controller having an optical input/output port, the memory controller being operable to receive and transmit optical signals at the wavelengths of the optical signals transmitted or received by the optical memory modules in a plurality of the memory modules;

a programming circuit coupled to circuitry in the optical memory hub, the programming circuit being operable to receive a programming signal and to output a signal to the optical memory hub that causes the optical memory hub to receive or transmit optical signals having one of the plurality of wavelengths; and an optical communication path coupling the optical input/output port of the memory controller to the optical input/output port of the optical memory hubs of a plurality of the memory modules.

25. The computer system of claim 24 wherein the memory controller is included in the system controller.

26. The computer system of claim 24 wherein the optical signals coupled to the optical hubs in a plurality of the memory modules have a first wavelength and the optical signals coupled from the optical hubs in a plurality of the memory modules have a second wavelength that is different from the first wavelength.

27. The computer system of claim 24 wherein the optical signals coupled to the optical hubs in a plurality of the memory modules comprise optical write data signals having a first wavelength and the optical signals coupled from the optical hubs in a plurality of the memory modules comprise optical read data signals having a second wavelength that is different from the first wavelength.

28. The computer system of claim 24 wherein the optical signals coupled to the optical hubs in each of the memory modules comprise optical address or command signals having a wavelength that is different from the wavelength of the optical address or command signals coupled to the memory hub in each of the other memory modules in the memory system.

29. The computer system of claim 26 wherein the optical signals coupled to the optical hubs in each of the memory modules further comprise optical write data signals having a wavelength that is different from the wavelength of the optical address or command signals coupled to the memory hubs in the memory modules.

30. The computer system of claim 29 wherein the optical signals coupled from the optical hubs in each of the memory modules further comprise optical read data signals having the same wavelength as the optical write data signals.

31. The computer system of claim 28 wherein the optical signals coupled from the optical hubs in each of the memory modules further comprise optical read data signals having a wavelength that is different from the wavelength of the optical address or command signals coupled to the memory hubs in the memory modules.

32. The computer system of claim 24 wherein the optical input signals coupled to and the optical output signals coupled from the memory hub on each of the memory modules has a wavelength that is different from the wavelength of the optical input signals coupled to and the optical output signals coupled from the memory hub on each of the other memory modules in the memory system.

33. The computer system of claim 24 wherein the optical memory hub is operable to output optical signals at a first wavelength corresponding to electrical read data signals received from at least one of the memory devices, to output electrical write data signals corresponding to optical signals received at the optical port having a second wavelength, and to output electrical command and address signals corresponding to optical signals received at the optical port having a third wavelength.

34. The computer system of claim 24 wherein each of the memory modules further comprises a plurality of wavelength detecting electrical terminals, and wherein the programming circuit comprises a detection circuit coupled to the wavelength detecting electrical terminals and to the optical memory hub, the detection circuitry being operable to detect which wavelength detecting electrical terminal is coupled to a predetermined voltage and to cause the optical hub to transmit or receive an optical signal having a wavelength corresponding to which of the wavelength detecting electrical terminal receives the predetermined voltage.

35. The computer system of claim 24 wherein the memory module includes an electrical terminal to which a select signal may be coupled, the electrical terminal being coupled to the optical memory hub, and wherein the optical memory hub is operable to receive or transmit optical signals at a frequency corresponding to the wavelength of an optical signal being received by the optical memory hub when a select signal is applied to the electrical terminal.

36. The computer system of claim 24 wherein the optical memory hub is operable to transmit signal packets corresponding to electrical signals input to the electrical input terminals of the optical memory hub and to receive signal packets corresponding to electrical signals output from the electrical output terminals of the optical memory hub.

37. The computer system of claim 24 wherein the optical communication path comprises at least one optical waveguide coupling the optical input/output port of the controller to the optical input/output port of the optical memory hubs of a plurality of the memory modules.

38. The computer system of claim 24 wherein the controller is operable to communicate with the memory modules using a wavelength division multiplexing protocol that varies as a function of the number of memory modules in the computer system.

39. The computer system of claim 24 wherein the controller is operable to communicate with the memory modules using a wavelength division multiplexing protocol that varies as a function of a the nature of a software application being executed by the computer system.

40. A method of coupling memory command, address and data signals to and/or from each of a plurality of memory modules, comprising coupling optical signals corresponding to memory command, addresses and write data signals to the memory modules and coupling optical signals corresponding to read data signals from the memory modules, at least some of the optical signals being coupled at a wavelength that is different from a wavelength that is used to coupled at least one of the other optical signals and programming each of the memory modules to select one of a plurality of wavelengths at which the memory module receives or transmits at least some of the optical signals.

41. The method of claim 40 wherein the act of coupling optical signals corresponding to memory command, addresses and write data signals comprises coupling optical signals corresponding to at least some of the memory command, addresses and write data signals to each of the memory modules at a wavelength that is different from a wavelength used to couple optical signals corresponding to at least some of the memory command, addresses and write data signals to any of the other memory modules.

42. The method of claim 40 wherein the act of coupling optical signals corresponding to memory command, addresses and write data signals comprises coupling optical signals corresponding to the memory command and addresses signals to each of the memory modules at a wavelength that is different from a wavelength used to couple optical signals corresponding to the memory command and addresses signals to any of the other memory modules.

43. The method of claim 42 wherein the act of coupling optical signals corresponding to write data signals to each of the memory modules comprises coupling optical signals corresponding to write data signals to each of the memory modules at a first wavelength that is different from the wavelengths of the optical signals corresponding to the memory command and addresses signals coupled to each of the memory modules.

44. The method of claim 43 wherein the act of coupling optical signals corresponding to read data signals from the memory modules comprises coupling optical signals corresponding to read data signals from the memory modules at the first wavelength.

45. The method of claim 40 wherein the act of coupling optical signals corresponding to memory command, addresses and write data signals to the memory modules and the act of coupling optical signals corresponding to read data signals from the memory modules comprises coupling optical signals corresponding to memory command, addresses and write data signals to each of the memory modules and coupling optical signals corresponding to read data signals from each of the memory modules at a wavelength that is different from the wavelengths of optical signals coupled or from a plurality of the other memory modules.

46. The method of claim 40 wherein the act of coupling optical signals to and from the memory modules comprises coupling optical signals to and from the memory modules in the form of optical signal packets.

47. The method of claim 40 wherein the act of coupling optical signals to and from the memory modules comprises coupling optical signals to and from the memory modules through at least one optical waveguide.

48. The method of claim 40 wherein the act of coupling optical signals to and from the memory modules comprises coupling optical signals to and from the memory modules through free space.

49. The method of claim 40 wherein the act of programming each of the memory modules to select one of a plurality of wavelengths at which the memory module receives or transmits at least some of the optical signals comprises:

determining in which one of a plurality of connectors the memory module is inserted; and programming the memory module to select a wavelength corresponding to the connector in which the memory module is inserted.

50. The method of claim 40 wherein the act of programming each of the memory modules to select one of a plurality of wavelengths at which the memory module receives or transmits at least some of the optical signals comprises:

coupling an optical signal having a first wavelength to each of the memory modules; and applying a select signal to one of the memory modules to cause the memory module to select the first wavelength as the wavelength at which the memory module receives or transmits at least some of the optical signals.

51. A method of coupling memory command, address and write data signals to each of a plurality of memory modules and of coupling read data signals from each of a plurality of memory modules, comprising coupling optical signals corresponding to the memory command, address and write data signals to each of the memory modules at a wavelength that is different from a wavelength used to couple the optical signals corresponding to the memory command, address and write data signals to each of the other memory modules and coupling optical signals corresponding to the read data signals from each of the memory modules at a wavelength that is different from a wavelength used to couple the optical signals corresponding to the read data signals to each of the other memory modules, and programming each of the memory modules to select one of a plurality of wavelengths at which the memory module receives or transmits at least some of the optical signals.

52. The method of claim 51 wherein the act of coupling optical signals to and from the memory modules comprises coupling optical signals to and from the memory modules in the form of optical signal packets.

53. The method of claim 51 wherein the act of coupling optical signals to and from the memory modules comprises coupling optical signals to and from the memory modules through at least one optical waveguide.

54. The method of claim 51 wherein the act of coupling optical signals to and from the memory modules comprises coupling optical signals to and from the memory modules through free space.

55. The method of claim 51 wherein the act of programming each of the memory modules to select one of a plurality of wavelengths at which the memory module receives or transmits at least some of the optical signals comprises:

determining in which one of a plurality of connectors the memory module is inserted; and programming the memory module to select a wavelength corresponding to the connector in which the memory module is inserted.

56. The method of claim 51 wherein the act of programming each of the memory modules to select one of a plurality of wavelengths at which the memory module receives or transmits at least some of the optical signals comprises:

coupling an optical signal having a first wavelength to each of the memory modules; and applying a select signal to one of the memory modules to cause the memory module to select the first wavelength as the wavelength at which the memory module receives or transmits at least some of the optical signals.

57. A method of coupling memory command, address and write data signals to each of a plurality of memory modules and of coupling read data signals from each of a plurality of memory modules, comprising:

coupling optical signals corresponding to the memory command and address signals to each of the memory modules at a wavelength that is different from a wavelength used to couple the optical signals corresponding to the memory command and address signals to each of the other memory modules;

coupling optical signals corresponding to the write data signals to a plurality of the memory modules at a first wavelength that is different from the wavelengths of the optical signals corresponding to the memory command and address signals coupled to each of the memory modules; coupling optical signals corresponding to the read data signals from a plurality of the memory modules at a second wavelength that is different from the wavelengths of the optical signals corresponding to the memory command and address signals coupled to each of the memory modules; and programming each of the memory modules to select one of a plurality of wavelengths at which the memory module receives or transmits at least some of the optical signals.

58. The method of claim 57 wherein the first wavelength is identical to the second wavelength.

59. The method of claim 57 wherein the act of coupling optical signals to and from the memory modules comprises coupling optical signals to and from the memory modules in the form of optical signal packets.

60. The method of claim 57 wherein the act of coupling optical signals to and from the memory modules comprises coupling optical signals to and from the memory modules through at least one optical waveguide.

61. The method of claim 57 wherein the act of coupling optical signals to and from the memory modules comprises coupling optical signals to and from the memory modules through free space.

62. The method of claim 57 wherein the act of programming each of the memory modules to select one of a plurality of wavelengths at which the memory module receives optical signals corresponding to the memory command and address signals comprises:

determining in which one of a plurality of connectors the memory module is inserted; and programming the memory module to select a wavelength corresponding to the connector in which the memory module is inserted.

63. The method of claim 57 wherein the act of programming each of the memory modules to select one of a plurality of wavelengths at which the memory module receives optical signals corresponding to the memory command and address signals comprises:

coupling an optical signal having a predetermined wavelength to each of the memory modules; and applying a select signal to one of the memory modules to cause the memory module to select the wavelength as the wavelength at which the memory module receives optical signals corresponding to the memory command and address signals.

* * * * *